(12) United States Patent
Yoo et al.

(10) Patent No.: US 10,962,606 B2
(45) Date of Patent: Mar. 30, 2021

(54) WIRE DIAGNOSIS APPARATUS MOUNTED ON LIFTING DEVICE

(71) Applicant: Nkia Co., Ltd., Seongnam-si (KR)

(72) Inventors: Sung Soo Yoo, Anyang-si (KR); Ki Hoon Shin, Anyang-si (KR); Sang Hun Nam, Yongin-si (KR); In Soo Jang, Yongin-si (KR); Tae Yeop Kwon, Yongin-si (KR)

(73) Assignee: NKIA CO., LTD., Seongnam-si (KR)

( * ) Notice: Subject to any disclaimer, the term of this patent is extended or adjusted under 35 U.S.C. 154(b) by 0 days.

(21) Appl. No.: 16/598,357

(22) Filed: Oct. 10, 2019

(65) Prior Publication Data
US 2020/0309839 A1 Oct. 1, 2020

(30) Foreign Application Priority Data
Apr. 1, 2019 (KR) .................. 10-2019-0037919

(51) Int. Cl.
*G01R 31/58* (2020.01)
*G01R 33/02* (2006.01)

(52) U.S. Cl.
CPC ............. *G01R 31/58* (2020.01); *G01R 33/02* (2013.01)

(58) Field of Classification Search
CPC ........ G01R 33/02; G01R 33/038; B21C 47/02
See application file for complete search history.

(56) References Cited

U.S. PATENT DOCUMENTS

| 8,708,172 | B2 * | 4/2014 | Kim ...................... B66C 19/002 |
| | | | 212/328 |
| 2008/0213073 | A1 * | 9/2008 | Benedict .................. B66C 7/12 |
| | | | 414/279 |
| 2015/0198463 | A1 * | 7/2015 | Weischedel ............ G01B 7/026 |
| | | | 324/207.25 |

FOREIGN PATENT DOCUMENTS

| KR | 100456638 | 11/2004 |
| KR | 20130128261 | 11/2013 |
| KR | 2020140002823 | 5/2014 |
| KR | 101590627 | 2/2016 |

OTHER PUBLICATIONS

Korean Office Action—Korean Application No. 10-2019-0037919 dated Aug. 5, 2020, citing KR 10-0456638 and KR 10-2013-0128261.

* cited by examiner

*Primary Examiner* — Alvaro E Fortich
(74) *Attorney, Agent, or Firm* — Cantor Colburn LLP

(57) ABSTRACT

Provided is a wire diagnosis apparatus mounted on a lifting device, which has a platform having a hook disposed at a lower portion to lift an object. The wire diagnosis apparatus includes: a standing unit detachably combined with any one among an inlet and an outlet where a wire of the platform comes in and out; a sensing holder unit formed in a cylindrical shape perforated in the middle and detachably combined with a stand combining part of the standing unit to sense the wire; and a coupling unit detachably combining the sensing holder unit with the stand combining part of the standing unit.

10 Claims, 13 Drawing Sheets

WIRE DIAGNOSIS APPARATUS MOUNTED ON LIFTING DEVICE

BACKGROUND OF THE INVENTION

Field of the Invention

The present invention relates to a wire diagnosis apparatus mounted on a lifting device capable of lifting an object, and more particularly, to a wire diagnosis apparatus mounted on a lifting device for lifting an object, which can diagnose a wire of the lift device in real time.

Background Art

In general, a lifting device for lifting an object using a wire includes: a support; a winding drum rotatably combined with the support, wherein a wire is wound on the circumferential surface of the winding drum; a driving motor for operating the winding drum; a plurality of upper sheaves rotatably combined with the support; a platform disposed at a lower portion of the support; and a plurality of lower sheaves combined with the platform. The wire passes via circumferential portions of the upper sheaves and lower sheaves in order, and a front end portion of the wire is fixed to the support or the platform.

In this instance, the platform has a hook disposed at a lower portion thereof so that an object is caught to the hook to be lifted. Moreover, the upper sheaves and the lower sheaves are of a wheel type having a concave groove in the circumferential surface thereof. Therefore, in a state where the object is caught to the hook, when the driving motor rotates the winding drum forwards or backwards to wind up or release the wire, the platform is lifted up by actions of the upper sheaves and the lower sheaves to lift up or lower the object by an action of the upper sheaves and the lower sheaves.

However, because the conventional lifting device may cause a big accident if the wire is cut by damage of the wire, the lifting device requires an apparatus for diagnosing the condition of the wire in real time.

PATENT LITERATURE

Patent Documents

Patent Document 1: Korean Patent No. 10-1590627 (granted on Jan. 26, 2016, and entitled 'crane')
Patent Document 1: Korean Utility Model Publication No. 20-2014-0002823 (published on May 14, 2014, and entitled 'elevatable pulley for crane'

SUMMARY OF THE INVENTION

Accordingly, the present invention has been made to solve the above-mentioned problems occurring in the prior arts, and it is an object of the present invention to provide a wire diagnosis apparatus mounted on a lifting device capable of lifting an object, which can diagnose a wire of the lift device in real time and can be easily replaced with a new one if the diagnosis apparatus has a breakdown since having modulated components.

To accomplish the above object, according to the present invention, there is provided wire diagnosis apparatus mounted on a lifting device, which has a platform having a hook disposed at a lower portion to lift an object, the wire diagnosis apparatus including: a standing unit detachably combined with any one among an inlet and an outlet where a wire of the platform comes in and out; a sensing holder unit formed in a cylindrical shape perforated in the middle and detachably combined with a stand combining part of the standing unit to sense the wire; and a coupling unit detachably combining the sensing holder unit with the stand combining part of the standing unit.

According to a preferred embodiment of the present invention, the standing unit includes: a stand body part detachably combined with any one among the inlet and the outlet where the wire of the platform comes in and out; and the stand combining part formed on an upper portion of the stand body part, wherein the stand combining part includes a sliding guide part for guiding sliding, and a sliding part sliding by the sliding guide part and detachably combined by combining parts of the sensing holder unit and the coupling unit.

According to a preferred embodiment of the present invention, the sensing holder part includes: a first holder body part; a second holder body part; and a holder coupling part formed in a cylindrical shape perforated in the middle to couple the first holder body part and the second holder body part with each other.

According to a preferred embodiment of the present invention, each of the first holder body part and the second holder body part includes: an upper cover formed in a horseshoe type; a lower cover formed in a horseshoe type and having a combining part detachably combined with the sliding part of the stand combining part by the coupling unit; a sensor part formed between the upper cover and the lower cover in even numbers to sense the wire; and a roller part formed between the upper cover and the lower cover in odd numbers to reduce friction generated from the wire.

According to a preferred embodiment of the present invention, the sensor part includes: a first magnet part formed at one side of the sensor part and having a magnet; a second magnet part formed at the other side of the sensor part and having a magnet; and a magnetic field sensor part formed midway between the first magnet part and the second magnet part to sense the wire.

According to a preferred embodiment of the present invention, the magnetic field sensor part measures a leakage magnetic flux generated by the magnets of the first magnet parts and the second magnet parts to generate the diagnosis result and transmits the diagnosis result to a user terminal.

In another aspect of the present invention, there is provided a wire diagnosis apparatus mounted at any one among an inlet and an outlet where a wire of a platform of a lifting device, which has the platform having the hook at the lower portion in order to lift an object, comes in and out to sense the wire, the wire diagnosis apparatus including: a first holder body part; a second holder body part; and a holder coupling part detachably combined with the first holder body part and the second holder body part to couple the first holder body part and the second holder body part into a cylindrical shape perforated in the middle.

According to a preferred embodiment of the present invention, each of the first holder body part and the second holder body part includes: an upper cover formed in a horseshoe type; a battery part; and a plurality of sensor parts formed between the upper cover and the battery part to sense the wire.

According to a preferred embodiment of the present invention, the sensor part includes: a roller part formed at upper and lower portions of the sensor part to reduce friction of the wire; a first magnet part formed at one side of the sensor part and having a magnet; a second magnet part formed at the other side of the sensor part and having a magnet; a magnetic field sensor part formed midway between the first magnet part and the second magnet part to sense the wire.

According to a preferred embodiment of the present invention, the magnetic field sensor part measures a leakage magnetic flux generated by the magnets of the first magnet parts and the second magnet parts to generate the diagnosis result and transmits the diagnosis result to a user terminal.

The wire diagnosis apparatus mounted on a lifting device for lifting an object according to the present invention can diagnose a wire of the lifting device in real time to check whether or not there is something wrong with the wire.

Moreover, the wire diagnosis apparatus mounted on a lifting device according to the present invention can be easily replaced with a new one if the diagnosis apparatus has a breakdown since having modulated components.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
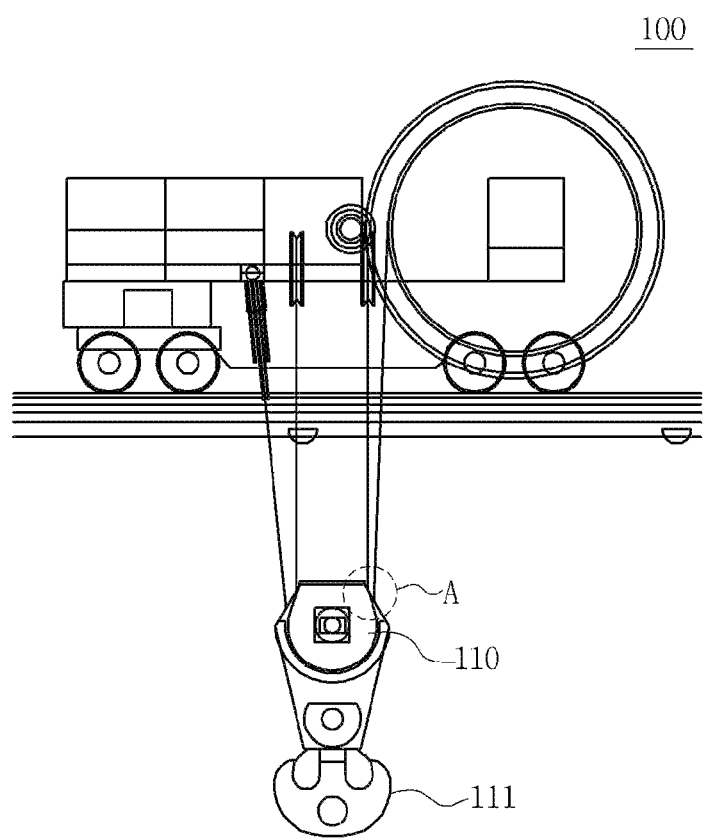
FIG. 1 is a view showing a conventional lifting device.

Hereinafter, the embodiments of the present disclosure will be described in detail with reference to accompanying drawings so that the embodiments may be easily implemented by those skilled in the art. However, the present disclosure may be implemented in various ways without being limited to the embodiments. In addition, in the drawings, well-known elements or components may be omitted to avoid unnecessarily obscuring the presented embodiments, and like reference numerals denote like elements throughout the specification.

Throughout this specification, when a part is referred to as being "connected" to another part, this includes "direct connection" and "indirect connection" via an intervening part. Also, when a certain part "includes" a certain component, other components are not excluded unless explicitly described otherwise, and other components may in fact be included.

Hereinafter, embodiments of the present invention will be described in detail with reference to the accompanying drawings as follows.

FIG. 1 is a view showing a conventional lifting device. As shown in FIG. 1, the conventional lifting device 100 includes: a support; a winding drum rotatably combined with the support, wherein a plurality of wires are wound on the circumferential surface of the winding drum; a driving motor for operating the winding drum; a plurality of upper sheaves rotatably combined with the support; a platform 110 disposed at a lower portion of the support and having a hook 111; and a plurality of lower sheaves combined with the platform in such a way that some of an upper portion is exposed to the outside. The wire passes via circumferential surfaces of the upper sheaves and lower sheaves.

Figure 2A:
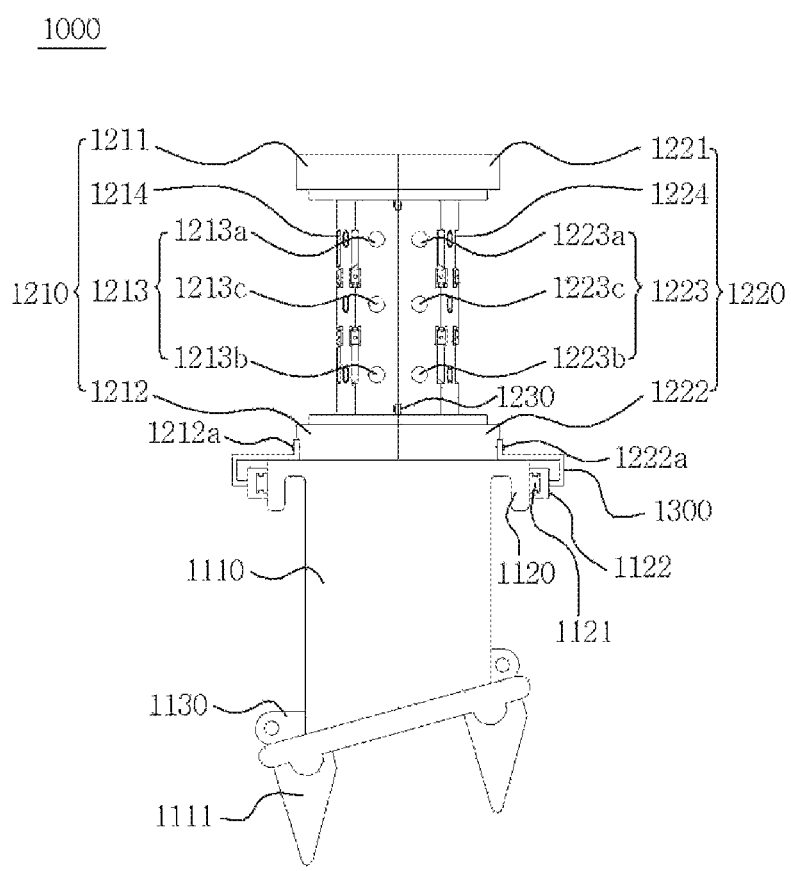
FIG. 2a is a side view of a diagnosis apparatus according to a first embodiment of the present invention.
Figure 2B:
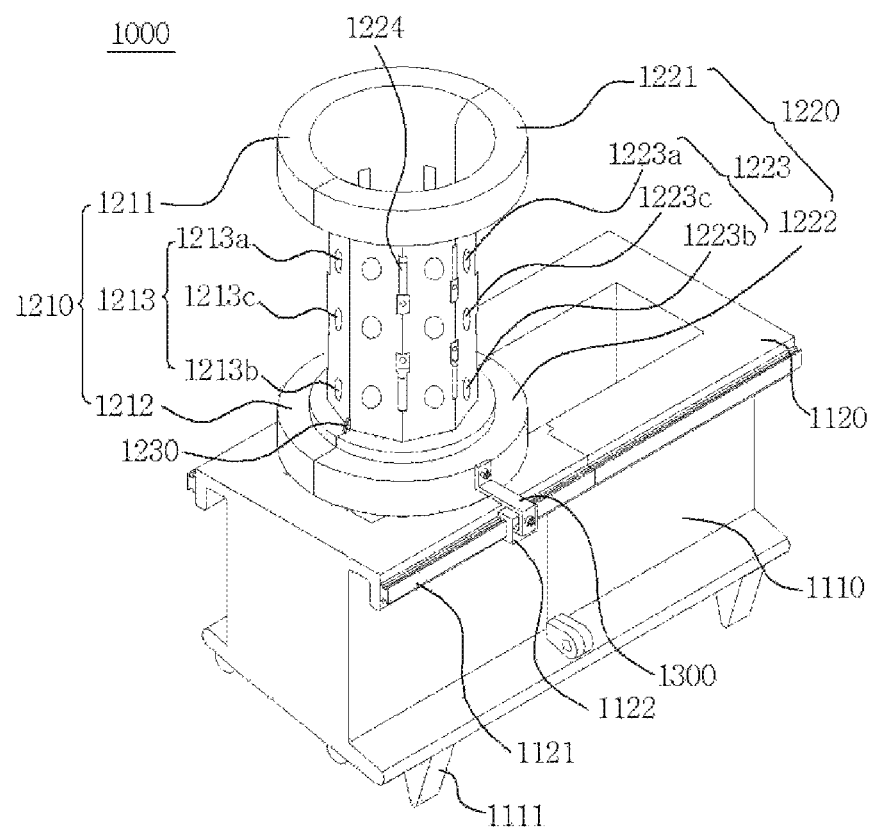
FIG. 2b is a perspective view of the diagnosis apparatus according to the embodiment of the present invention.

FIG. 2a is a side view of a diagnosis apparatus according to a first embodiment of the present invention, and FIG. 2b is a perspective view of the diagnosis apparatus according to the embodiment of the present invention. As shown in FIGS. 2a and 2b, the wire diagnosis apparatus 1000 according to the present invention includes: a standing unit 1100 detachably combined with any one among an inlet and an outlet where a wire of the platform 110, which is an "A" part in FIG. 1 comes in and out; a sensing holder unit 1200 formed in a cylindrical shape perforated in the middle so that the wire passes therethrough and detachably combined with a stand combining part 1120 of the standing unit 1100 to sense the wire; and a coupling unit 1300 detachably combining the sensing holder unit 120 with the stand combining part 1120 of the standing unit 1100.

Figure 3A:
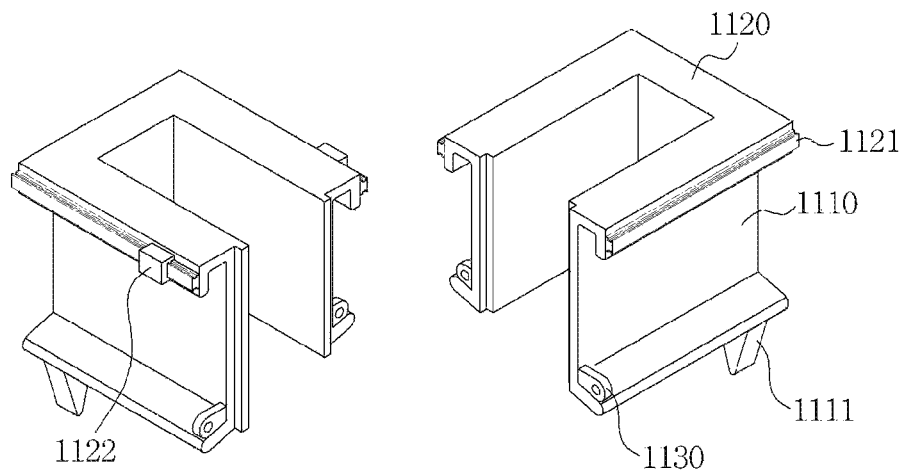
FIG. 3a is an exploded perspective view of a standing unit of the diagnosis apparatus according to the embodiment of the present invention.
Figure 3B:
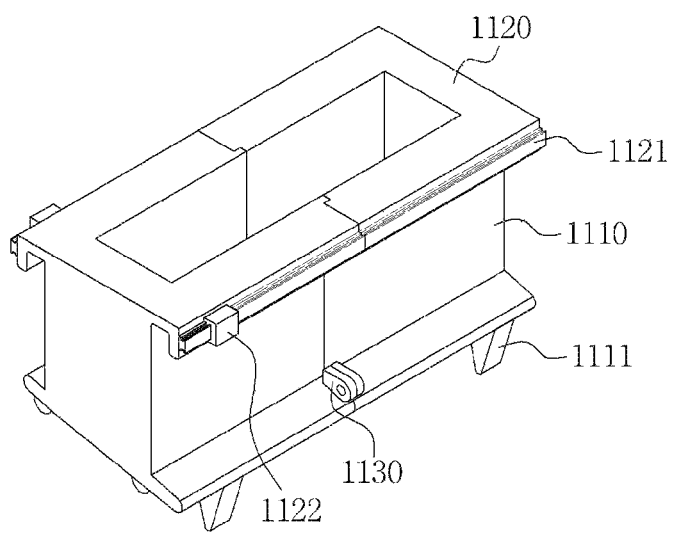
FIG. 3b is a perspective view showing a combined state of the standing unit of the diagnosis apparatus according to the embodiment of the present invention.

FIG. 3a is an exploded perspective view of a standing unit of the diagnosis apparatus according to the embodiment of the present invention, and FIG. 3b is a perspective view showing a combined state of the standing unit of the diagnosis apparatus according to the embodiment of the present invention. As shown in FIGS. 3a and 3b, the standing unit 1100 includes: a stand body part 1110 detachably combined with any one among the inlet and the outlet where the wire of the platform 110 comes in and out; and the stand combining part 1120 formed on an upper portion of the stand body part 1110 so that the sensing holder unit 1200 is detachably combined with the stand body part 1110. Furthermore, the standing unit 1100 further includes a stand coupling part 1130 for uniting the standing unit 1100 into one through screw coupling. Additionally, the stand combining part 1120 further includes: a sliding guide part 1121 for guiding lateral sliding; and a sliding part 1122 guided by the sliding guide part 1121 to slide laterally. The sliding part 1122 is screw-coupled with the coupling unit 1300 to fix the sensing holder unit 1200.

The stand body part 1110 of the standing unit 1100 is detachably combined with any one among the inlet and the outlet where the wire of the platform 110 comes in and out, and preferably, is simply fit and fixed to any one among the inlet and the outlet of the platform 110 through a combining member 1111 formed at a lower portion of the stand body part 1110. In addition, the standing unit 1100 must be manufactured in consideration of sizes of the inlet and the outlet of the platform 110 in order to be fit and fixed to any one among the inlet and the outlet where the wire of the platform 110 comes in and out.

Figure 4A:
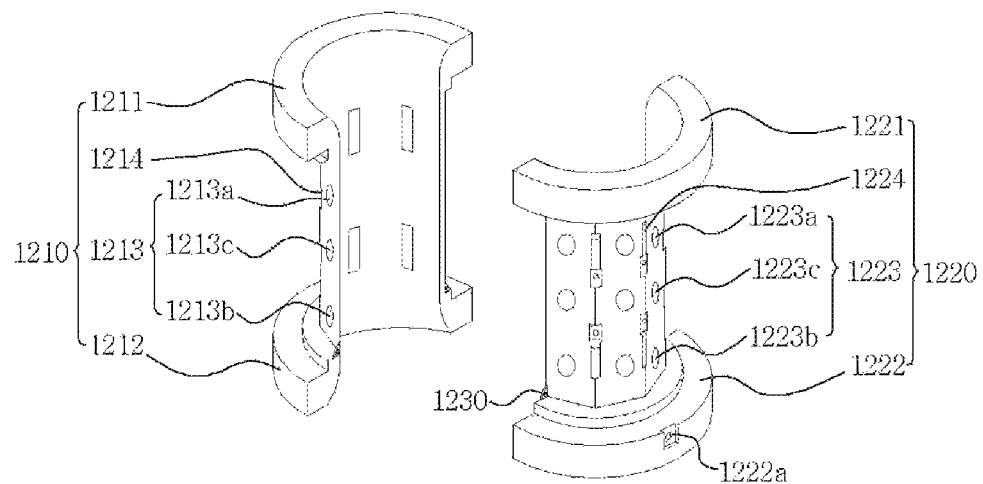
FIG. 4a is an exploded perspective view showing a sensing holder unit of the diagnosis apparatus according to the embodiment of the present invention.
Figure 4B:
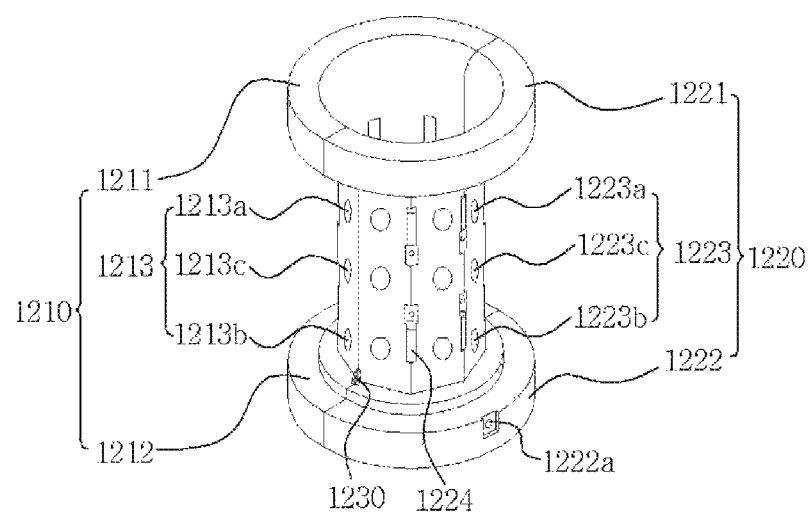
FIG. 4b is a view showing a combined state of the sensing holder unit of the diagnosis apparatus according to the embodiment of the present invention.

FIG. 4a is an exploded perspective view showing a sensing holder unit of the diagnosis apparatus according to the embodiment of the present invention, and FIG. 4b is a view showing a combined state of the sensing holder unit of the diagnosis apparatus according to the embodiment of the present invention. As shown in FIGS. 4a and 4b, the sensing holder unit 1200 includes: a first holder body part 1210; a second holder body part 1220; and a holder coupling part 1230 formed in a cylindrical shape perforated in the middle to couple the first holder body part 1210 and the second holder body part 1220 with each other.

The holder coupling part 1230 has a cylindrical shape perforated in the middle when the first holder body part 1210 and the second holder body part 1220 are united together through screw coupling. Therefore, if one among the first holder body part 1210 and the second holder body part 1220 has a breakdown, a user removes the screw coupling of the holder coupling part 1230 to easily replace the broken part with a new one.

Moreover, each of the first holder body part 1210 and the second holder body part 1220 includes: an upper cover 1211 and 1221 formed in a horseshoe type; a lower cover 1212 and 1222 formed in a horseshoe type; a sensor part 1213 and 1223 formed between the upper cover 1211 and 1221 and the lower cover 1212 and 1222 in even numbers to sense the wire; and a roller part 1214 and 1224 formed between the upper cover 1211 and 1221 and the lower cover 1212 and 1222 in odd numbers to reduce friction generated from the wire. Furthermore, each of combining parts 1212a and 1222a is formed at one side of each of the lower covers 1212 and 1222. The combining parts 1212a and 1222a are screw-coupled with the coupling unit 1300 and are fixed to the sliding part 1122 of the stand combining part 1120 of the standing unit 1100. Preferably, four sensor parts 1213 and four sensor parts 1223 are respectively formed on the first holder body part 1210 and the second holder body part 1220, and three roller parts 1214 and three roller parts 1224 are respectively formed on the first holder body part 1210 and the second holder body part 1220.

Additionally, each of the sensor parts 1213 and 1223 includes: a first magnet part 1213a and 1223a formed at one side of the sensor part 1213 and 1223 and having a magnet; a second magnet part 1213b and 1223b formed at the other side of the sensor part 1213 and 1223 and having a magnet; and a magnetic field sensor part 1213c and 1223c formed midway between the first magnet part 1213a and 1223a and the second magnet part 1213b and 1223b to sense the wire.

As described above, the wire diagnosis apparatus 1000 according to the present invention includes the standing unit 1100 and the sensing holder unit 1200. The standing unit 1100 and the sensing holder unit 1200 are simply combined with each other when the sliding part 1122 of the stand combining part 1120 of the standing unit 1100 and the combining parts 1212a and 1222a of the lower covers 1212 and 1222 of the sensing holder unit 1200 are screw-coupled with each other through the coupling unit 1300.

Figure 5:
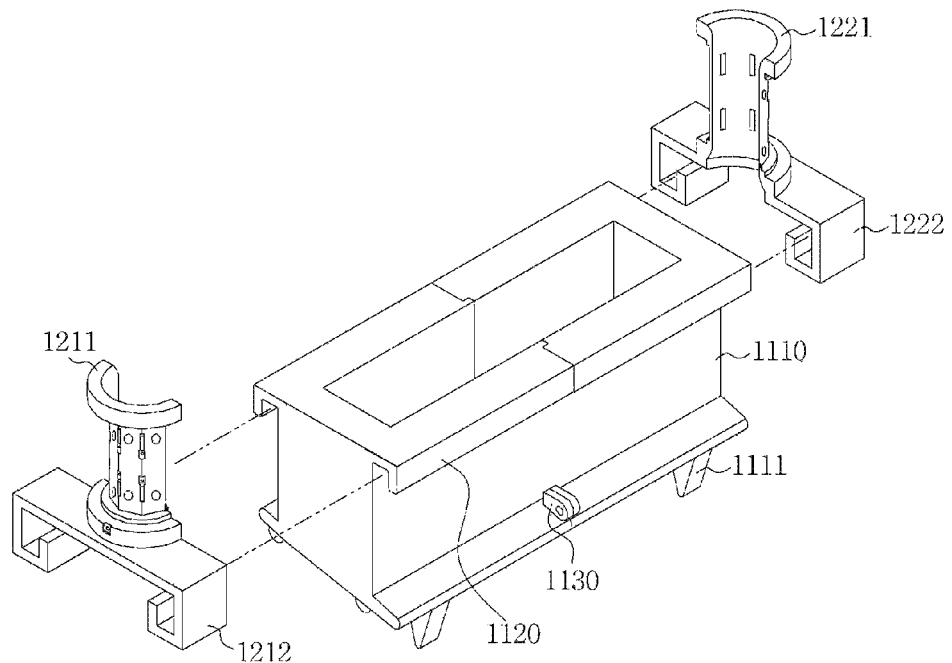
FIG. 5 is a view showing a combined state of the diagnosis apparatus according to the embodiment of the present invention.

FIG. 5 is a view showing a combined state of the diagnosis apparatus according to the embodiment of the present invention. As shown in FIG. 5, the standing unit 1100 and the sensing holder unit 1200 may be combined with each other in different way from the above. The lower covers of the sensing holder unit 1200 of the wire diagnosis apparatus 1000 have the structure illustrated in the drawing. The lower covers 1212 and 1222 are simply fit to the stand combining part 1120 of the standing unit 1100 and are screw-coupled through the holder coupling part 1230 so that the sensing holder unit 1200 is combined and fixed with the standing unit 1100.

Figure 6:
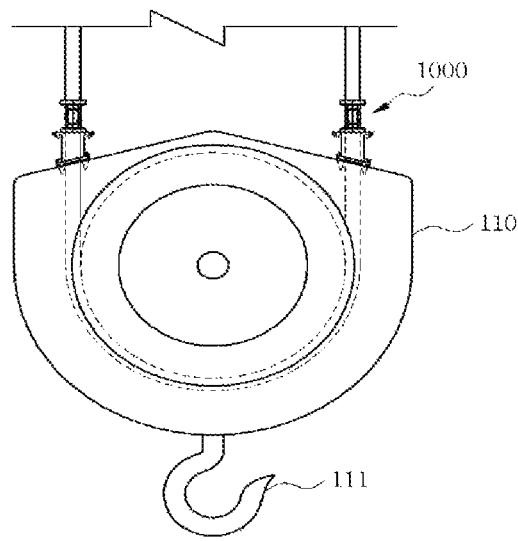
FIG. 6 is a view showing an example of the diagnosis apparatus according to the embodiment of the present invention.

FIG. 6 is a view showing an example of the diagnosis apparatus according to the embodiment of the present invention. As shown in FIG. 6, the user fits and fixes the stand body part 1110 of the standing unit 1100 of the wire diagnosis apparatus 10000 through the combining member 1111 to any one among the inlet and the outlet where the wire of the platform 110 of the lifting device 100 comes in and out, and then, couples the standing unit 1100 by the stand coupling part 1130 through screw coupling. After that, the user couples the first holder body part 110 and the second holder body part 1220 of the sensing holder unit 1200 by the holder coupling part 1230 through screw coupling. After that, the user screw-couples the sliding part 1122 of the stand combining part 1120 of the standing unit 1100 and the combining parts 1212a and 1222a of the sensing holder unit 1200 by the coupling unit 1300, so that the magnetic field sensor parts 1213c and 1223c of the holder body part 1210 senses the wire of the lifting device 100 to diagnose the wire.

Figure 7:
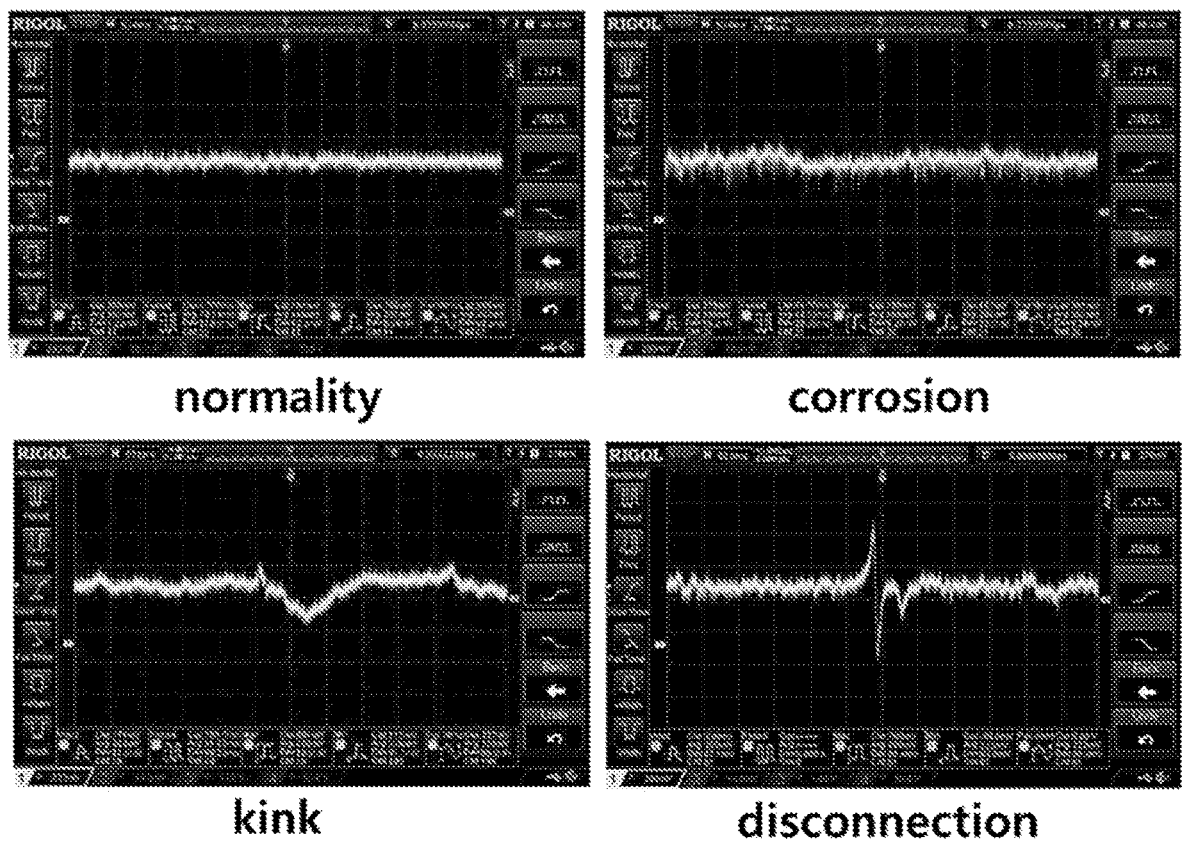
FIG. 7 is a view showing wire diagnosis of the diagnosis apparatus according to the embodiment of the present invention.

FIG. 7 is a view showing wire diagnosis of the diagnosis apparatus according to the embodiment of the present invention. As shown in FIG. 7, the magnetic field sensor parts 1213c and 1223c generate a diagnosis result by sensing the wire. The magnetic field sensor parts 1213c and 1223c measure a leakage magnetic flux generated by the magnets of the first magnet parts 1213a and 1223a and the second magnet parts 1213b and 1223b to generate the diagnosis result. The diagnosis result may be expressed in the form of normality, corrosion, kink, disconnection, and so on. Moreover, the magnetic field sensor parts 1213c and 1223c transmit the diagnosis result to a user terminal in real time. Thus, the user can check the condition of the wire of the lifting device 100 in real time in order to prevent the occurrence of an accident.

Figure 8:
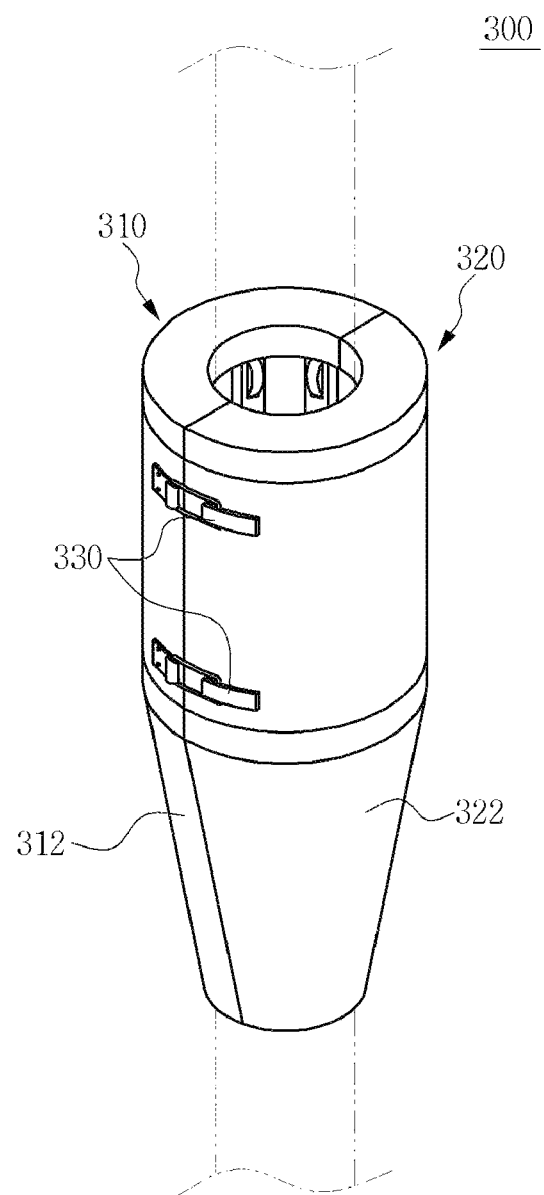
FIG. 8 is a view showing a first example of the diagnosis apparatus according to a second embodiment of the present invention.
Figure 9:
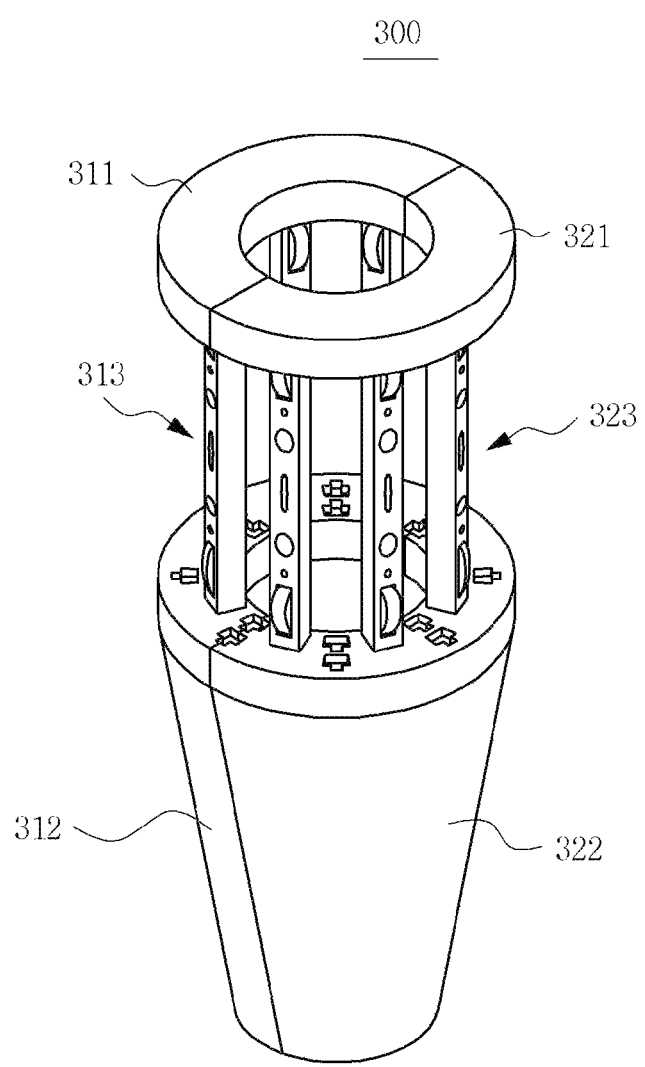
FIG. 9 is a view showing a second example of the diagnosis apparatus according to the second embodiment of the present invention.

FIG. 8 is a view showing a first example of the diagnosis apparatus according to a second embodiment of the present invention, and FIG. 9 is a view showing a second example of the diagnosis apparatus according to the second embodiment of the present invention. As shown in FIGS. 8 and 9, the wire diagnosis apparatus 300 mounted at any one among the inlet and the outlet where the wire of the platform 110 of the lifting device 100, which has the platform 110 having the hook 111 at the lower portion in order to lift an object, comes in and out to sense the wire includes: a first holder body part 310, a second holder body part 320, and a holder coupling part 330 which couples the first holder body part 310 and the second holder body part 320 into a cylindrical shape perforated in the middle. Furthermore, the holder coupling part 330 is detachably combined with the first holder body part 310 and the second holder body part 320, and then, couples the first holder body part 310 and the second holder body part 320 into the cylindrical shape.

Figure 10:
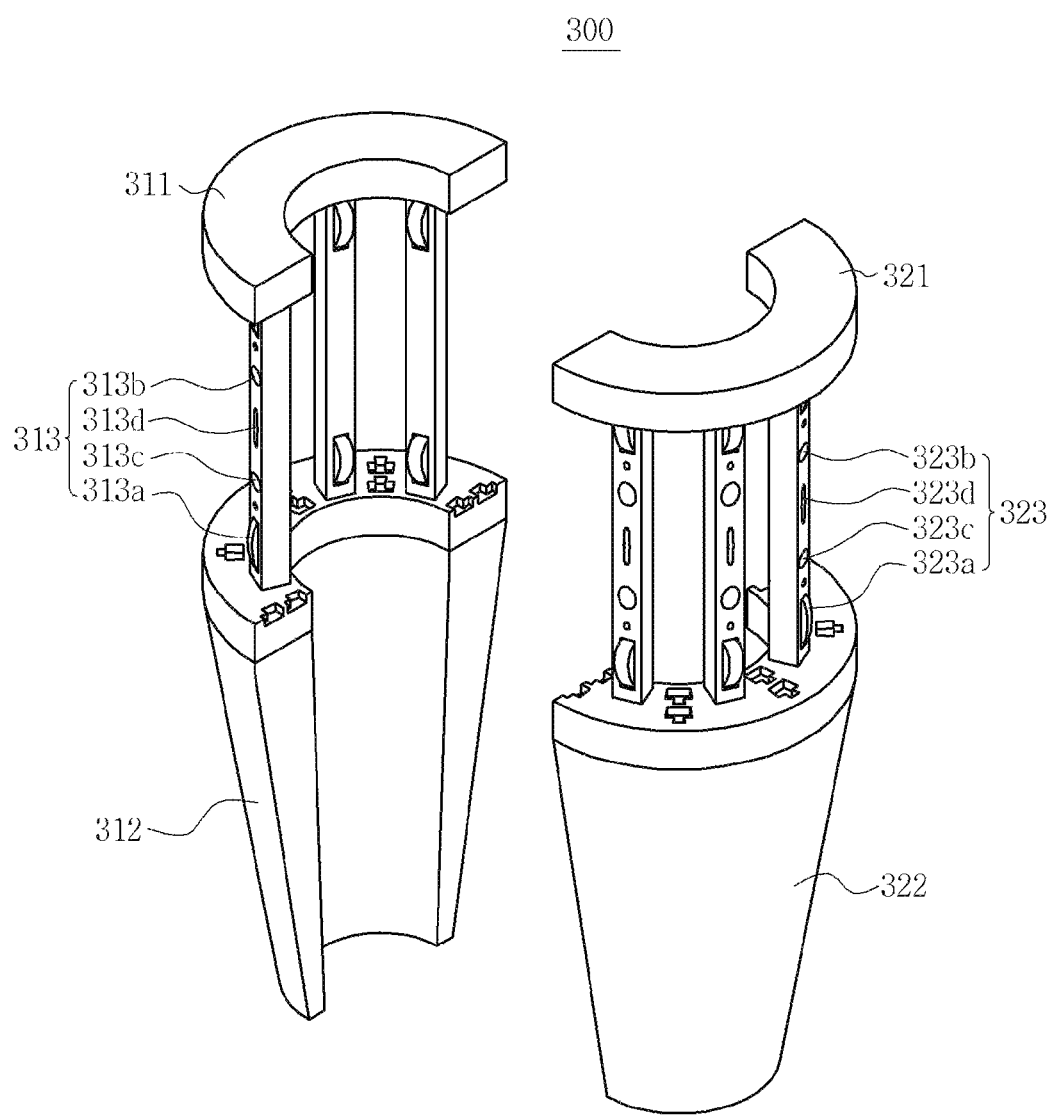
FIG. 10 is an exploded perspective view of the diagnosis apparatus according to the second embodiment of the present invention.

FIG. 10 is an exploded perspective view of the diagnosis apparatus according to the second embodiment of the present invention. As shown in FIG. 10, each of the first holder body part 310 and the second holder body part 320 includes: an upper cover 311 and 321 formed in a horseshoe type; a battery part 312 and 322 formed in a semi-conical shape; and a plurality of sensor parts 313 and 323 formed between the upper cover 311 and 321 and the battery part 312 and 322 to sense the wire. The battery parts 312 and 322 supply electric power so that the sensor parts 313 and 323 can sense the wire, to prevent the wire diagnosis apparatus 300 from being entangled into the platform 110 by the wire. Preferably, four sensor parts 313 and four sensor parts 323 are respectively disposed between the upper covers 311 and 321 and the battery parts 312 and 322.

Moreover, each of the sensor parts 313 and 323 includes: a roller part 313a and 323a formed at upper and lower portions of the sensor part to reduce friction of the wire; a first magnet part 313b and 323b formed at one side of the sensor part 313 and 323 and having a magnet; a second magnet part 313c and 323c formed at the other side of the sensor part 313 and 323 and having a magnet; and a magnetic field sensor part 313d and 323d formed midway between the first magnet part 313b and 323b and the second magnet part 313c and 323c to sense the wire.

The first holder body part 310 and the second holder body part 320 of the wire diagnosis apparatus 300 according to the present invention is coupled by the holder coupling part 330 and is mounted at any one among the inlet and the outlet where the wire of the platform 110 of the lifting device 100 goes in and out, diagnoses the wire of the lifting device to generate a diagnosis result as illustrated in FIG. 7, and transmits the diagnosis result to the user terminal in real time.

Preferably, the user terminal may be any one among cellular phones, smart phones, tablet computers, notebook computers, terminals for digital broadcasting, personal digital assistants (PDAs), portable multimedia players (PMPs), and so on.

Preferably, communication between the wire diagnosis apparatus 1000 and 300 and the user terminal may be near field communication, such as Bluetooth, radio frequency identification (RFID), infrared data association (IrDA), ultra wideband (UWB), ZigBee, wireless LAN (WLAN), and so on.

Figure 11:
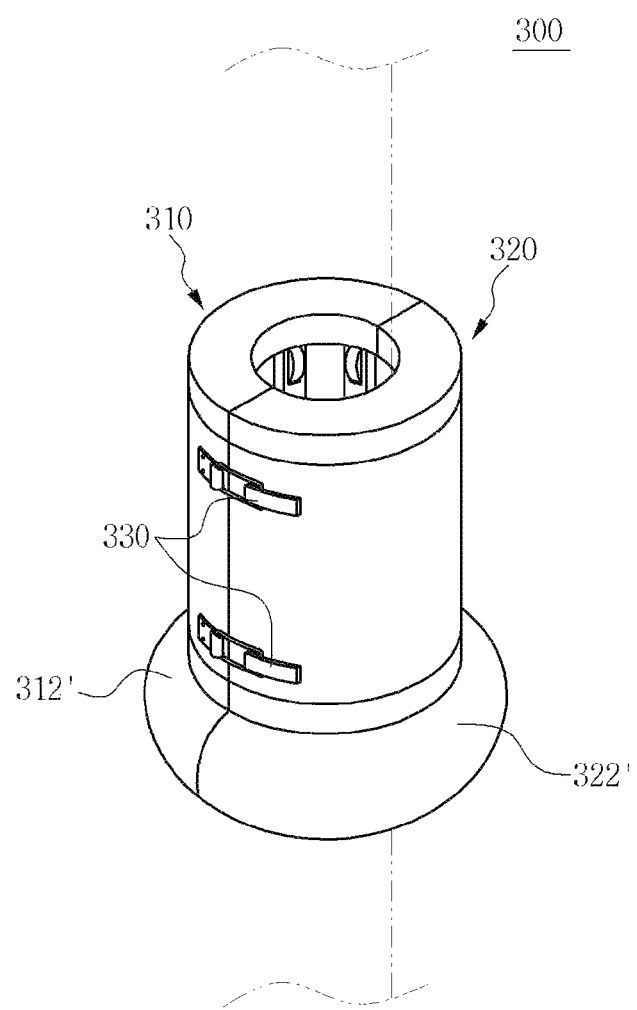
FIG. 11 is a view showing a third example of the diagnosis apparatus according to the second embodiment of the present invention.
Figure 12:
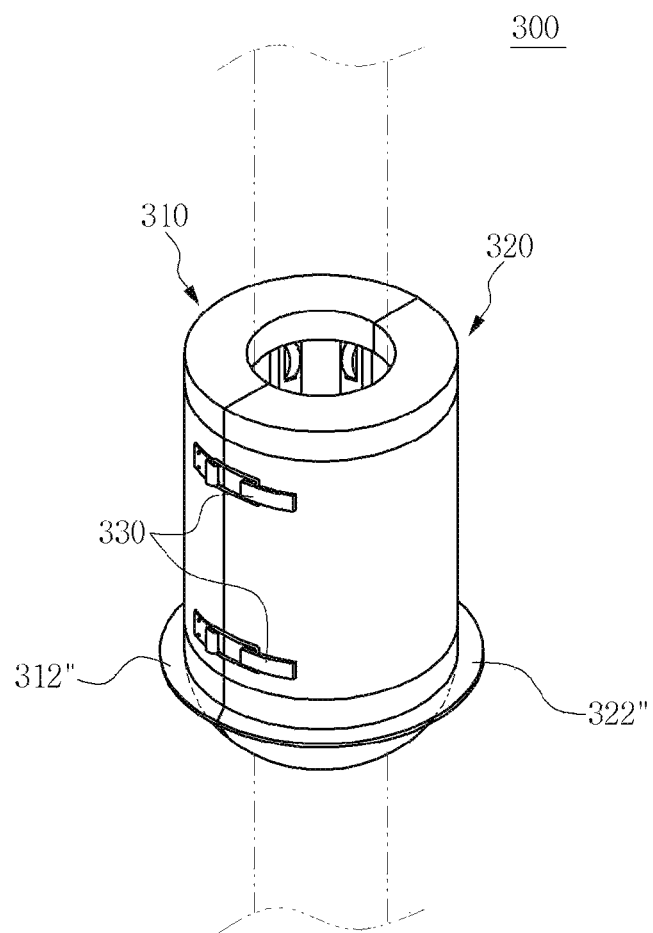
FIG. 12 is a view showing a fourth example of the diagnosis apparatus according to the second embodiment of the present invention.
Figure 13:
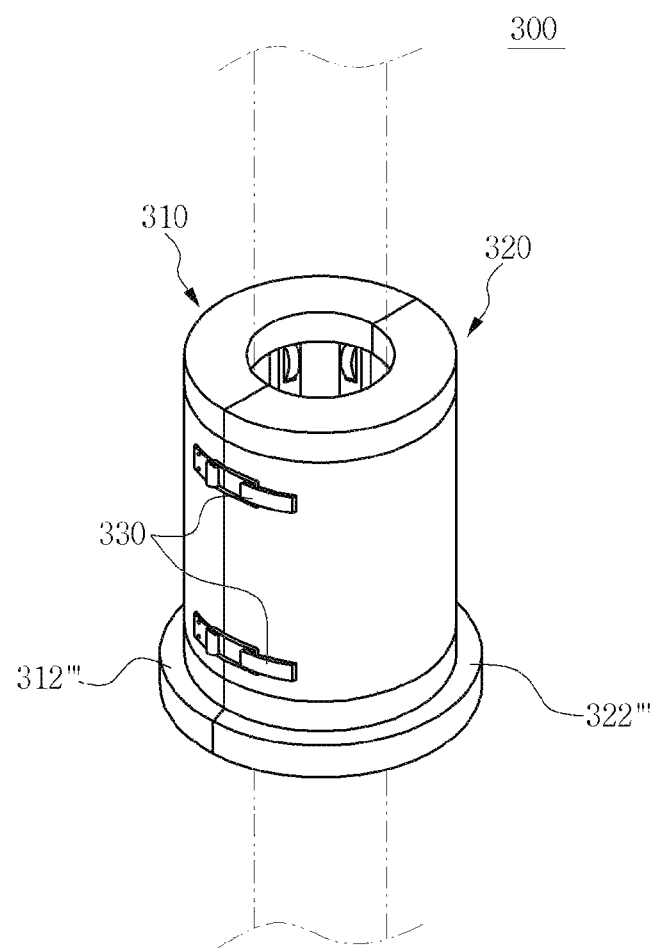
FIG. 13 is a view showing a fifth example of the diagnosis apparatus according to the second embodiment of the present invention.

Additionally, the wire diagnosis apparatus 300 according to the present invention has the same structure as the diagnosis apparatus 300 illustrated in FIGS. 8 to 10, except the form of the battery part, and it is illustrated in FIGS. 11 to 13. FIG. 11 is a view showing a third example of the diagnosis apparatus according to the second embodiment of the present invention, FIG. 12 is a view showing a fourth example of the diagnosis apparatus according to the second embodiment of the present invention, and FIG. 13 is a view showing a fifth example of the diagnosis apparatus according to the second embodiment of the present invention. First, when the first holder body part 310 and the second holder body part 320 are combined with each other, battery parts 312' and 322' may have the form illustrated in FIG. 11. Next, when the first holder body part 310 and the second holder body part 320 are combined with each other, battery parts 312" and 322" may have the form illustrated in FIG. 12. Alternatively, when the first holder body part 310 and the second holder body part 320 are combined with each other, battery parts 312''' and 322''' may have the form illustrated in FIG. 13.

As described above, the battery parts have various forms to be fit to the lifting device because there are various kinds of lifting device. That is, as shown in FIGS. 8, 11, 12 and 13, the wire diagnosis apparatus 300 according to the present invention may have various forms according to kinds of the lifting device so as to prevent the wire diagnosis apparatus 300 from being entangled in and damaged by the wire of the lifting device.

Therefore, the user installs the wire diagnosis apparatus 1000 and 300 at any one among the inlet and the outlet where the wire of the platform 110 of the lifting device 100, which is installed on an elevator, a sluice gate or a crane, goes in and out, and checks the diagnosis result through the user terminal when the wire diagnosis apparatus 1000 and 300 diagnoses the wire in real time, in order to prevent an accident which may occur due to corrosion of the wire. Furthermore, because the components of the wire diagnosis apparatus 1000 and 300 are modulated, it is easy to assemble and disassemble the components, and a broken component if one of the components of the diagnosis apparatus 1000 and 300 is broken can be easily replaced with a new one.

As described above, while the present invention has been particularly shown and described with reference to the example embodiments thereof, it will be understood by those of ordinary skill in the art that various changes may be made in the present invention without departing from the technical scope and idea of the present invention and all or some of the embodiments of the present invention may be selectively combined. Therefore, it would be understood that the actual technical protection scope of the present invention must be determined by the spirit of the appended claims.

What is claimed is:

1. A wire diagnosis apparatus mounted on a lifting device, which has a platform having a hook disposed at a lower portion to lift an object, the wire diagnosis apparatus comprising:
   a standing unit detachably combined with any one among an inlet and an outlet where a wire of the platform comes in and out;
   a sensing holder unit formed in a cylindrical shape perforated in the middle and detachably combined with a stand combining part of the standing unit to sense the wire; and
   a coupling unit detachably combining the sensing holder unit with the stand combining part of the standing unit.

2. The wire diagnosis apparatus according to claim 1, wherein the standing unit comprises:
   a stand body part detachably combined with any one among the inlet and the outlet where the wire of the platform comes in and out; and
   the stand combining part formed on an upper portion of the stand body part, wherein the stand combining part includes a sliding guide part for guiding sliding, and a sliding part sliding by the sliding guide part and detachably combined by combining parts of the sensing holder unit and the coupling unit.

3. The wire diagnosis apparatus according to claim 1, wherein the sensing holder part comprises:
   a first holder body part;
   a second holder body part; and
   a holder coupling part formed in a cylindrical shape perforated in the middle to couple the first holder body part and the second holder body part with each other.

4. The wire diagnosis apparatus according to claim 3, wherein each of the first holder body part and the second holder body part comprises:
- an upper cover formed in a horseshoe type;
- a lower cover formed in a horseshoe type and having a combining part detachably combined with the sliding part of the stand combining part by the coupling unit;
- a sensor part formed between the upper cover and the lower cover in even numbers to sense the wire; and
- a roller part formed between the upper cover and the lower cover in odd numbers to reduce friction generated from the wire.

5. The wire diagnosis apparatus according to claim 4, wherein the sensor part comprises:
- a first magnet part formed at one side of the sensor part and having a magnet;
- a second magnet part formed at the other side of the sensor part and having a magnet; and
- a magnetic field sensor part formed midway between the first magnet part and the second magnet part to sense the wire.

6. The wire diagnosis apparatus according to claim 5, wherein the magnetic field sensor part measures a leakage magnetic flux generated by the magnets of the first magnet parts and the second magnet parts to generate the diagnosis result and transmits the diagnosis result to a user terminal.

7. A wire diagnosis apparatus mounted at any one among an inlet and an outlet where a wire of a platform of a lifting device, which has the platform having the hook at the lower portion in order to lift an object, comes in and out to sense the wire, the wire diagnosis apparatus comprising:
- a first holder body part;
- a second holder body part; and
- a holder coupling part detachably combined with the first holder body part and the second holder body part to couple the first holder body part and the second holder body part into a cylindrical shape perforated in the middle.

8. The wire diagnosis apparatus according to claim 7, wherein each of the first holder body part and the second holder body part comprises:
- an upper cover formed in a horseshoe type;
- a battery part; and
- a plurality of sensor parts formed between the upper cover and the battery part to sense the wire.

9. The wire diagnosis apparatus according to claim 8, wherein the sensor part comprises:
- a roller part formed at upper and lower portions of the sensor part to reduce friction of the wire;
- a first magnet part formed at one side of the sensor part and having a magnet;
- a second magnet part formed at the other side of the sensor part and having a magnet;
- a magnetic field sensor part formed midway between the first magnet part and the second magnet part to sense the wire.

10. The wire diagnosis apparatus according to claim 9, wherein the magnetic field sensor part measures a leakage magnetic flux generated by the magnets of the first magnet parts and the second magnet parts to generate the diagnosis result and transmits the diagnosis result to a user terminal.

* * * * *